(12) United States Patent
Osada et al.

(10) Patent No.: US 6,977,858 B2
(45) Date of Patent: Dec. 20, 2005

(54) SEMICONDUCTOR DEVICE

(75) Inventors: Kenichi Osada, Tokyo (JP); Takayuki Kawahara, Higashiyamato (JP); Ken Yamaguchi, Fuchu (JP); Yoshikazu Saito, Hamura (JP); Naoki Kitai, Fussa (JP)

(73) Assignees: Renesas Technology Corp., Tokyo (JP); Hitachi Ulsi Systems Co., Ltd., Tokyo (JP)

( * ) Notice: Subject to any disclaimer, the term of this patent is extended or adjusted under 35 U.S.C. 154(b) by 134 days.

(21) Appl. No.: 10/728,965

(22) Filed: Dec. 8, 2003

(65) Prior Publication Data

US 2004/0125676 A1    Jul. 1, 2004

(30) Foreign Application Priority Data

Dec. 27, 2002  (JP) .............................. 2002-378947

(51) Int. Cl.[7] ................................................ G11C 7/00
(52) U.S. Cl. .................. 365/222; 365/230.03; 714/764
(58) Field of Search ........................... 365/189.05, 222, 365/230.03, 23.08; 714/764

(56) References Cited

U.S. PATENT DOCUMENTS

| 4,748,627 A | * | 5/1988 | Ohsawa ...................... 714/764 |
| 6,026,014 A | * | 2/2000 | Sato et al. ............. 365/185.03 |
| 6,714,471 B2 | * | 3/2004 | Kono ......................... 365/205 |

FOREIGN PATENT DOCUMENTS

| JP | 61-50295 | 8/1984 |
| JP | 7-45096 | 8/1993 |

* cited by examiner

Primary Examiner—VanThu Nguyen
(74) Attorney, Agent, or Firm—Reed Smith LLP; Stanley P. Fisher, Esq.; Juan Carlos A. Marquez, Esq.

(57) ABSTRACT

A semiconductor device comprises, a plurality of memory cells, and an error-correction circuit, wherein write operation is performed by a late-write method, and ECC processing is executed in parallel with writing, and thereby cycle time is shortened. Moreover, it is better that when a memory cell is power supplied through a well tap, the same address is not assigned while the memory cell is power supplied through the well tap.

9 Claims, 13 Drawing Sheets

| | | | |
|---|---|---|---|
| ☐ ACTIVE REGION | ▨ FIRST METAL LAYER | ☐ ML | ▨ MLCT |
| ▨ POLYSILICON LAYER | ⊠ FIRST VIA LAYER | ▦ SVG | |
| ▨ LOCAL INTERCONNECT | ⊡ SECOND METAL LAYER | ▨ SV | |
| ▨ CONTACT LAYER | ▨ FIELD INSULATING LAYER | ▨ SVC | |

SEMICONDUCTOR DEVICE

FIELD OF THE INVENTION

The present invention relates to a semiconductor device, and more particularly to an on-chip memory equipped with SRAM (static random access memory) memory cells.

DESCRIPTION OF THE RELATED ART

Japanese Patent Laid-Open No. Hei 7-45096 (patent document 1) discloses a circuit technology that corrects a fail bit by adding a parity bit to usual data. Japanese Patent Laid-Open No. Sho 61-50295 (patent document 2) discloses a circuit technology in which a part of data having the same parity bit is rewritten.

With the decrease in voltage applied to a memory cell, a cell size decreases, causing degradation in soft error immunity, which is a produced problem. In order to correct such a data error, it is effective to use an ECC (Error Correct Codes) circuit. However, if an 8-bit parity is assigned to each 64-bit data, rewriting only 16-bit data requires the following steps: reading 64-bit data and 8-bit parity bits, and then replacing a part of 64-bit data, an error of which has been corrected, with 16-bit data to write; and generating 8-bit parity bits before writing the regenerated parity bits and the data to write. Thus, the steps consume time, which causes degradation in cycle time. Moreover, a soft error is also caused by a cosmic ray, and the soft error causes by the cosmic ray produces a multi-cell error. Because in general the ECC circuit can correct only one bit error, an effect of improving soft error immunity cannot be expected even if the ECC circuit is used, which was the problem.

For these reasons, a first object of the present invention is to shorten writing time when using an ECC circuit, and thereby to shorten cycle time. A second object is to make it possible to correct an error by ECC even when a multi-cell error by a cosmic ray occurs.

SUMMARY OF THE INVENTION

Typical features of the present invention disclosed in this application concerned will be briefly outlined as below.

According to one aspect of the present invention, there is provided a semiconductor device, said semiconductor device comprising: a plurality of memory cells; an error-correction circuit; a latch circuit for storing data to write; a latch circuit for storing an address corresponding to the data to write, wherein write operation is performed by a late-write method. By adopting the late-write method in which actual writing is performed after the next writing address is inputted, it is possible to perform error correction, generation of data to write, and generation of parity bits, in parallel with the writing, which makes it possible to shorten cycle time.

According to another aspect of the present invention, there is provided a semiconductor device characterized in that memory cells between adjacent well taps are not simultaneously read out into an error-correction circuit. In other words, the semiconductor device is characterized in that when generating data to write, all addresses used when reading out data into the error-correction circuit from memory cells are changed by memory cells between adjacent well taps. Moreover, a semiconductor device may also be configured as follows: dividing a memory cell array into a plurality of blocks, each of which has areas for well tap formed on its both ends; and when generating data to write, assigning addresses in such a manner that data can be read out from only one memory cell for each block so as to input the data into an error-correction circuit.

DESCRIPTION OF THE PREFERRED EMBODIMENTS

Some preferred embodiments of a semiconductor storage device according to the present invention will be described with reference to drawings as below.

<First Embodiment>

Figure 1:
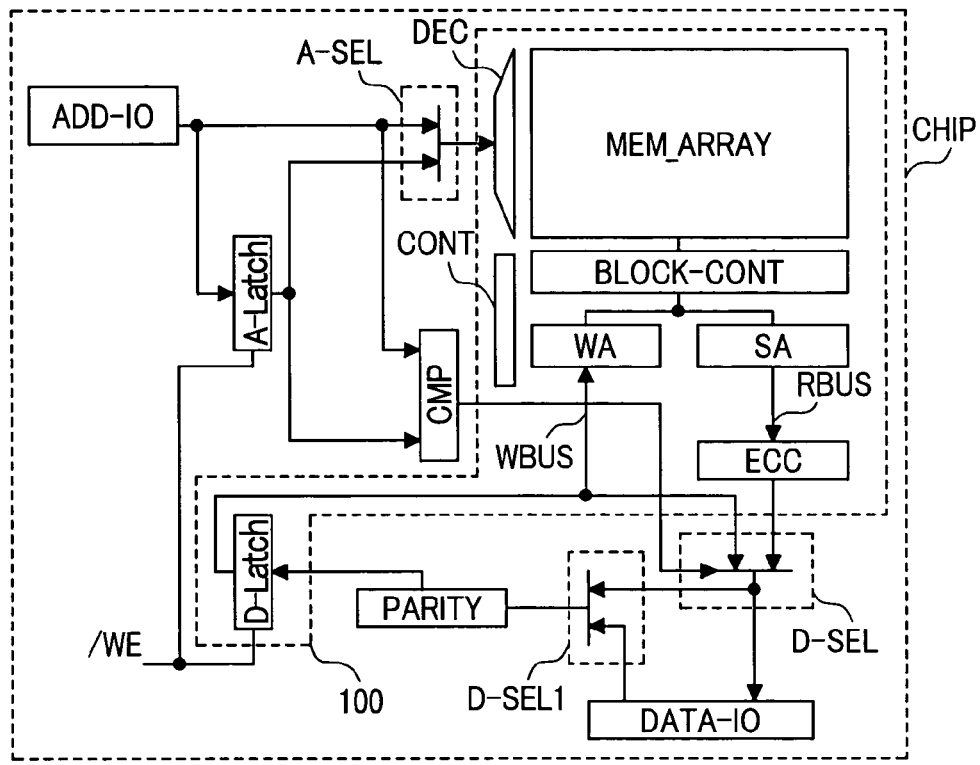
FIG. 1 is a schematic diagram illustrating an integrated circuit of a semiconductor device according to a first embodiment.

FIG. 1 is a circuit diagram illustrating one embodiment in which the present invention is applied to a SRAM.

A SRAM memory CHIP with ECC, which is a semiconductor storage device, comprises the following: an array area 100 comprising a memory array, and peripheral circuits which are placed around the memory array; an address input pad ADD_IO; a latch circuit A-Latch for latching an address; an address select circuit A-SEL that selects either data of the ADD-IO or data of the A-Latch, and that then sends the selected data to the array area 100; a comparator CMP that compares the data of the ADD-IO with the data of the A-Latch to detect whether or not the data agrees with each other; an I/O pad for data DATA-IO; a selector D-SEL that selects data from the array area 100, and that then sends the selected data to the DATA-IO; a D-SEL1 for selecting data of the D-SEL or data of the DATA-IO; and a circuit PARITY for generating parity.

The array area 100 comprises the following: a MEM_ARRAY in which memory cells are arranged on an array; a DEC for decoding a word; a sense amplifier SA that amplifies a bit line before reading data, and that stores the read data; a write amplifier WA for transferring data to write to the bit line; a column circuit BLOCK_CONT for performing column pre-charge and column select; an error-correction circuit ECC for correcting read data; a data bus for read data RBUS that connects between the error-correction circuit and the sense-amplifier latch circuit SA; a data latch circuit D-Latch for latching data; a data bus for write data WBUS that connects between the latch circuit D-Latch and the write amplifier WA; and a column control circuit CONT for controlling a column circuit. A first data path for connecting between the sense amplifier and the error-correction circuit is separated from a second data path for connecting between the write amplifier and the error-correction circuit. The second data path includes in its path a circuit for storing data to write and the parity generation circuit.

The latch circuit D-Latch for storing data to write has the capacity large enough to store two pieces of data to write or more. By providing the capacity large enough to store two addresses or more to the latch circuit A-Latch for storing an address, the latch circuit A-Latch can compare the addresses easily.

In the comparator that compares an address stored in the latch circuit for storing an address with an address inputted into the semiconductor device, only some bits of the addresses are compared. Here, if the address inputted into the semiconductor device is an address used for read operation, the following processing is performed: if the addresses agree with each other, outputting, to a data input/output pad, data stored in the latch circuit for storing data to write; and if the addresses do not agree with each other, reading data of a memory cell corresponding to the address, and then outputting the data to the data input/output pad via the error-correction circuit.

Figure 2:
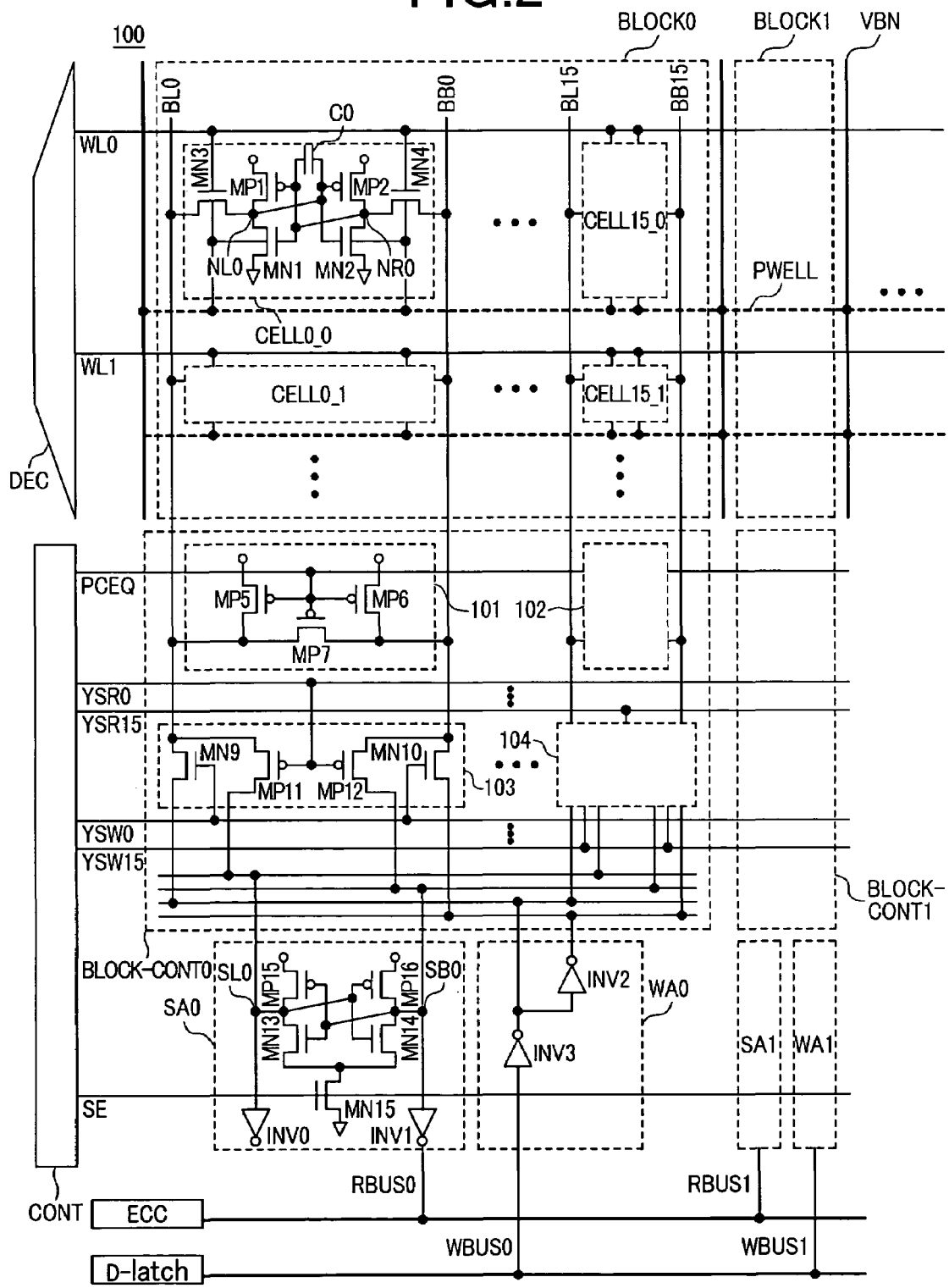
FIG. 2 is a circuit diagram illustrating the integrated circuit of the semiconductor device according to the first embodiment.

Next, the array area 100 will be described in detail with reference to FIG. 2. In the memory array MEM_ARRAY, blocks BLOCK, each of which is constituted of 16-bit columns, are aligned in a word-line direction. Between the blocks BLOCK, a wire VBN for P-type well tap is formed. A column circuit BLOCK_CONT is connected to each BLOCK; and the sense amplifier SA and the write amplifier WA are connected to the BLOCK_CONT. Data read from the sense amplifier SA is sent to the error-correction circuit ECC through the RBUS. Data to write is sent from the latch circuit D-Latch to the write amplifier WA through the WBUS. Additionally formed circuits include a circuit DEC for decoding a word, and a column control circuit CONT for controlling the BLOCK_CONT, the SA, and the WA.

A plurality of memory cells CELL are connected to bit lines (BL0, BB0). For example, a memory cell CELL0_0 comprises the following: a flip-flop in which inputs and outputs of a pair of CMOS inverters are mutually connected (P channel type MOS transistors (MP1, MP2) and N channel type transistors (MN1, MN2) form the flip-flop); and N channel type MOS transistors (MN3, MN4) that connect a storage node NL0, and a storage node NR0, of the flip-flop to the bit lines (BL0, BB0). A word line WL0 is connected to gate poly-silicons of the N channel type MOS transistors (MN3, MN4). Although the use of the error-correction circuit according to this embodiment offers good tolerance to a soft error, capacitance C may also be provided in the memory cell in order to further improve the tolerance to a soft error. In particularly, in the process of microminiaturization, instead of adding capacitance by use of a metal plate for power supply, providing capacitance between storage nodes by use of a layout of wire capacitance is effective. This is true also in the other embodiments described below. The P channel type MOS transistors (MP1, MP2) are formed in an N-type well, whereas the N channel type transistors (MN1, MN2, MN3, MN4) are formed in a P-type well PWELL. The N-type well and the P-type well are provided with insulation by field oxide, which is formed of LOCOS (Local Oxidation of Silicon) or trench isolation (Shallow Trench Isolation).

BLOCK_CONT0 comprises pre-charge and equalize circuits (101, 102) and Y switch circuits (103, 104). The pre-charge and equalize circuits (101, 102) are circuits used to precharge and equalize the bit lines (BL, BB), and comprises P channel type MOS transistors (MP5, MP6, MP7). A control signal for pre-charge and equalize circuit PCEQ is connected to gate poly-silicons of the P channel type MOS transistors (MP5, MP6, MP7).

The Y switch circuit 103 comprises P channel type MOS transistors (MP11, MP12) connecting the bit lines (BL0, BB0) to the sense amplifier SA0, and N channel type MOS transistors (MN9, MN10) connecting the bit lines (BL0, BB0) to the write amplifier WA0. The Y switch circuit 103 is controlled by control signals (YSR0, YSW0).

The Y switch circuit 104 is a circuit that connects bit lines (BL15, BB15) to the sense amplifier SA0 and the write amplifier WA. The Y switch circuit 104 is controlled by control signals (YSR15, YSW15).

The sense amplifier SA0 comprises the following: a flip-flop having P channel type MOS transistors (MP15, MP16) and N channel type MOS transistors (MN13, MN14); a latch type sense amplifier having an N channel type MOS transistor MN15 that activates the sense amplifier; and inverter circuits (INV0, INV1) that send amplified data. A sense amplifier control signal SE is connected to a gate poly-silicon of the MOS transistor MN15. If the sense amplifier is configured as a latching sense amplifier in which a cross-coupled connection is made, parallel processing of the following operation becomes possible: operation for generating data to write of a writing address that is inputted into address input terminals of the semiconductor device; and operation for writing the data to write to a memory cell indicated by a writing address inputted before the data generation. As actual operation, if a second writing address is inputted after a first writing address is inputted, the following are performed: operation by which data of a memory cell corresponding to the first address is read out into the sense amplifier before the second writing address is decoded; and operation by which parity is generated according to the data and is then stored in the latch circuit for storing data to write. Subsequently, the second writing address is decoded, and then data of a memory cell corresponding to the second writing address is stored in the sense amplifier before data stored in the latch circuit for storing data to write is written to a memory cell corresponding to the first address.

The write amplifier WA0 comprises inverter circuits (INV2, INV3).

Figure 3:
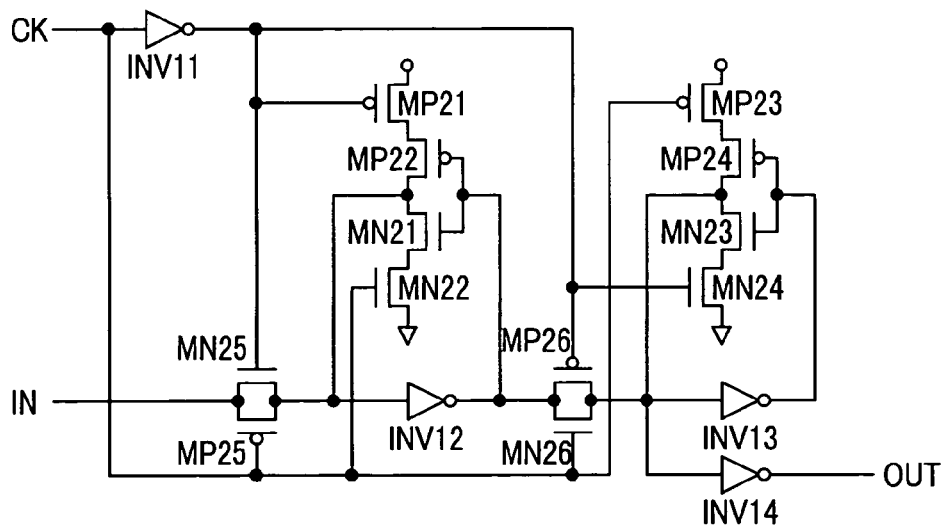
FIG. 3 is a circuit diagram illustrating the integrated circuit of the semiconductor device according to the first embodiment.

The latch circuits (A-Latch, D-Latch) include a flip-flop circuit as shown in FIG. 3. This circuit has two parts for keeping data. A first part for keeping data comprises an inverter INV12, and a clocked inverter constituted of P channel type MOS transistors (MP21, MP22) and N channel type MOS transistors (MN21, MN22). A second part for keeping data comprises an inverter INV13, and a clocked inverter constituted of P channel type MOS transistors (MP23, MP24) and N channel type MOS transistors (MN23, MN24). It is to be noted that a size of the transistor formed in a circuit for storing data is larger than that of the transistor used in a memory cell. In addition, the following circuits are also included as other circuits: pass transistor circuits (MN25, MP25) that send input data IN to the first part for keeping data; pass transistor circuits (MN26, MP26) provided between the first part for keeping data and the second part for keeping data; an inverter circuit INV11 for generating an inversion signal of a clock signal CK; and an inverter circuit INV14 that sends data of the second part for keeping data to an output signal OUT.

Figure 4:
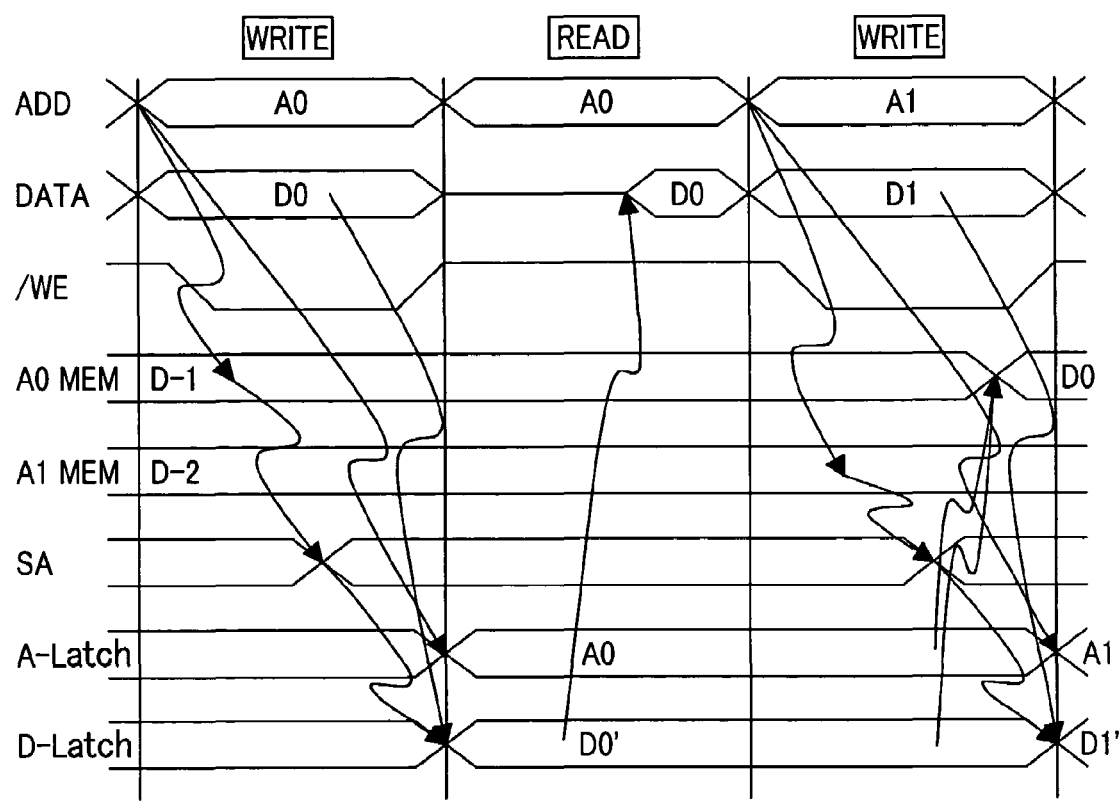
FIG. 4 illustrates operation waveforms of the integrated circuit of the semiconductor device according to the first embodiment.
Figure 5:
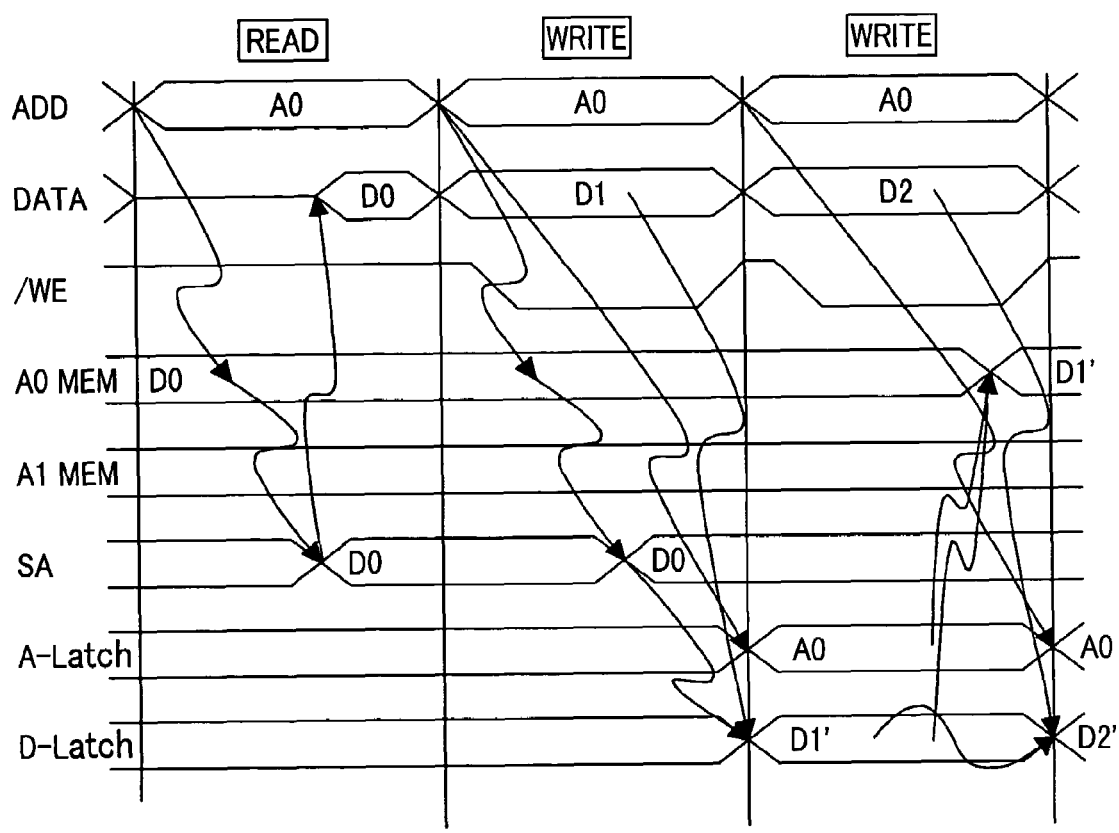
FIG. 5 illustrates operation waveforms of the integrated circuit of the semiconductor device according to the first embodiment.

Next, operation will be described by use of operation waveforms shown in FIGS. 4 and 5.

To begin with, operation shown in FIG. 4 will be described. A first cycle is a cycle during which data D0 is written to an address A0. Here, an address A0 is inputted into an address input buffer ADD-IO, and data to write D0 is inputted into a data input/output pad DATA-IO. Then, when a signal /WE indicating writing changes from high level 'H' to low level 'L' and is thereby activated, write operation starts. Next, the comparator CMP compares the inputted address A0 with data of the address latch A-Latch. If they do not agree with each other, usual read operation is performed, and consequently a memory array is accessed. First, data of a memory cell corresponding to high-order bits of the address A0, for example, D-1, is read out into the sense amplifier SA so that the data is latched. This data is, for example, 72-bit data constituted of a data part of 64 bits and a parity part of 8 bits. This 72-bit data is sent to an error-correction circuit ECC where an error is corrected. A part of the data in which the error has been corrected is replaced with D0 by a data selection circuit D-SEL1 by use of low-order bits of the address A0, and thereby data to write D0' is generated. The data D0 is, for example, 16-bit data.

An 8-bit parity of the data to write D0' is generated by the parity generation circuit, and the data is then stored in the data latch D-Latch. At the same time, the address A0 is also stored in the address latch A-Latch. In a second cycle, A0 data is read. The address A0 is inputted into the address input pad ADD-IO. When the signal /WE changes from 'L' to 'H' resulting in a read mode, the comparator CMP compares the inputted address A0 with data of the address latch A-Latch. If they do not agree with each other, usual read operation is performed, and thereby the memory array is accessed. In this case, however, because they agree with each other, the usual operation is not performed. Accordingly, the selector D-SEL selects D0 that is a part of data D0' stored in the data latch circuit DATA-IO. The D0 is then sent to the data buffer DATA-IO before the read operation ends. A third cycle is a cycle during which data D1 is written to an address A1. To begin with, an address A1 is inputted into the address input buffer ADD-IO, and data to write D1 is inputted into the data input/output pad DATA-IO. Then, when a signal /WE indicating writing changes from high level 'H' to low level 'L' and is thereby activated, write operation starts. Next, the comparator CMP compares the inputted address A1 with data of the address latch A-Latch. Because they do not agree with each other, usual read operation is performed, and consequently the memory array is accessed. First, data of a memory cell corresponding to high-order bits of the address A1, for example, D-2, is read out into the sense amplifier SA so that the data is latched. This data is, for example, 72-bit data constituted of a data part of 64 bits and a parity part of 8 bits. This 72-bit data is sent to the error-correction circuit ECC where an error is corrected. A part of the data in which the error has been corrected is replaced with D1 by the data selection circuit D-SEL1 by use of low-order bits of the address A1, and thereby data to write D1' is generated. The data D1 is, for example, 16-bit data. 8-bit parity of the data to write D1' is generated by the parity generation circuit, and the data is then stored in the data latch D-Latch. At the same time, the address A1 is also stored in the address latch A-Latch. Additionally, in parallel with this operation, on the basis of the address A0 of the address latch ADD-Latch, the data D0' of the data latch D-Latch is written to a corresponding memory cell A0 MEM. In this manner, applying the late-write method in which actual writing is performed in the next writing enables error correction and parity bit generation in parallel with write operation, which makes it possible to shorten a writing cycle.

Next, operation shown in FIG. 5 will be described. In a first cycle, data of an address A0 is read. The address A0 is inputted into the address input pad ADD-IO. When the signal /WE changes from 'L' to 'H' resulting in a read mode, the comparator CMP compares the inputted address A0 with data of the address latch A-Latch. Because they do not agree with each other, usual read operation is performed, and thereby the memory array is accessed. After data D0 of the memory cell A0 MEM corresponding to the address A0 is read, the data D0 is latched by the sense amplifier SA. The error-correction circuit ECC corrects an error of the data D0. Then, the data D0 is sent to the data input/output pad DATA-IO before the read operation ends. A second cycle is a cycle during which data D1 is written to an address A0. The address A0 is inputted into the address input pad ADD-IO, and data to write D1 is inputted into the data input/output pad DATA-IO. Then, when a signal /WE indicating writing changes from high level 'H' to low level 'L' and is thereby activated, write operation starts. Next, the comparator CMP compares the inputted address A0 with data of the address latch A-Latch. Because they do not agree with each other, usual read operation is performed, and thereby the memory array is accessed. First, data of a memory cell corresponding to high-order bits of the address A0, for example, D0, is read out into the sense amplifier SA so that the data is latched. This data is, for example, 72-bit data constituted of a data part of 64 bits and a parity part of 8 bits. This 72-bit data is sent to the error-correction circuit ECC where an error is corrected. A part of the data in which the error has been corrected is replaced with D1 by the data selection circuit D-SEL1 by use of low-order bits of the address A1, and thereby data to write D1' is generated. The data D1 is, for example, 16-bit data. 8-bit parity of the data to write D1' is generated by the parity generation circuit, and the data is then stored in the data latch D-Latch. At the same time, the address A0 is also stored in the address latch A-Latch. A third cycle is a cycle during which data D2 is written to the address A1. Here, the address A1 is inputted into the address input pad ADD-IO, and data to write D2 is inputted into the data input/output pad DATA-IO. Then, when a signal /WE indicating writing changes from high level 'H' to low level 'L' and is thereby activated, write operation starts.

Next, the comparator CMP compares the inputted address A0 with data of the address latch A-Latch. If they do not agree with each other, usual read operation is performed. However, in this case, they agree with each other. Accordingly, instead of performing the usual operation, the data D1' in the data latch D-Latch is selected by the selector D-SEL. This data is, for example, 72-bit data constituted of a data part of 64 bits and a parity part of 8 bits. The data selection circuit D-SEL1 replaces a part of the data with D2 by use of low-order bits of the address A1, and thereby data to write D2' is generated. The data D2 is, for example, 16-bit data. 8-bit parity of the data to write D2' is generated by the parity generation circuit, and the data is then stored in the data latch D-Latch. At the same time, the address A0 is also stored in the address latch A-Latch. Additionally, in parallel with this, on the basis of the address A0 of the address latch A-Latch, the data D1' of the data latch D-Latch is written to a corresponding memory cell A0 MEM. In this manner, applying the late-write method in which actual writing is performed in the next writing enables error correction and parity bit generation in parallel with the write operation, which makes it possible to shorten a writing cycle.

Moreover, this method can be applied not only to SRAM, but also to a flash memory, DRAM, a ferroelectric memory (Ferroelectric RAM), MRAM (Magnetic RAM), PRAM (Phase-change RAM), and the like.

<Second Embodiment>

Figures 6, 7:
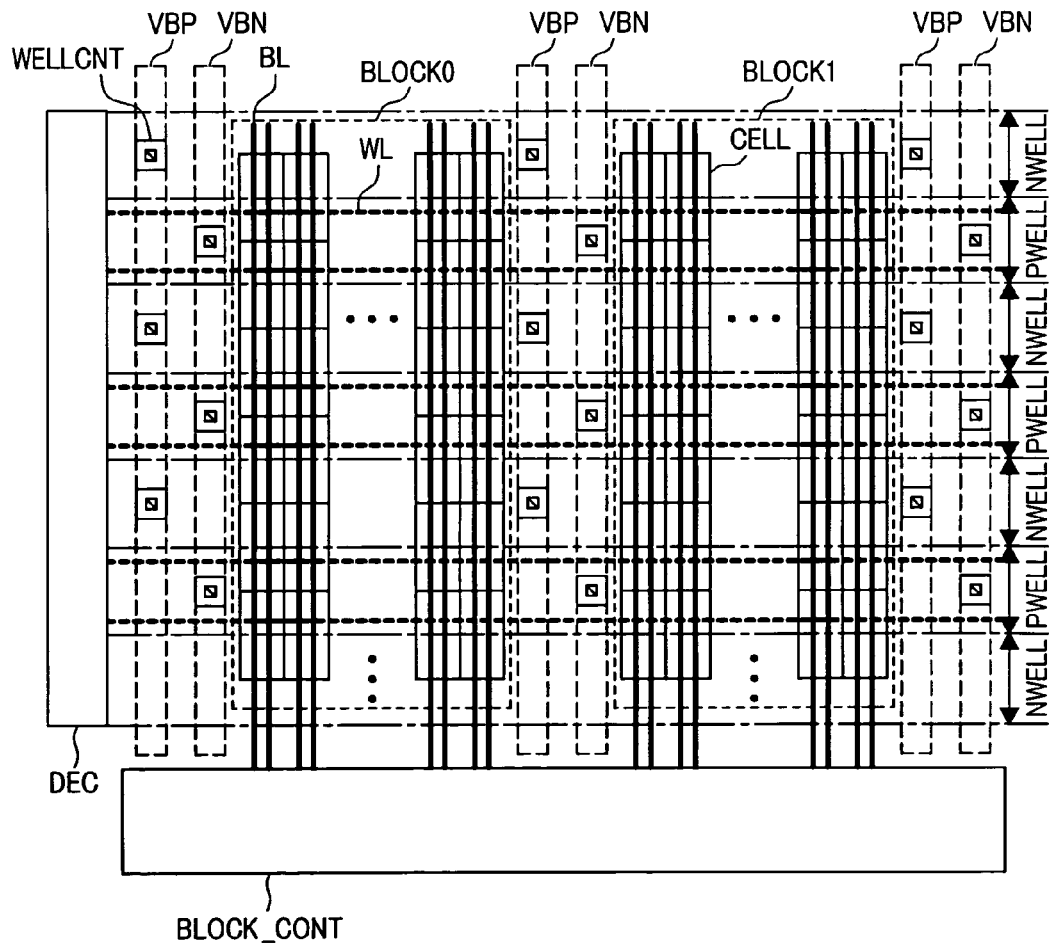
FIG. 6 is a diagram illustrating a layout layer of an integrated circuit of a semiconductor device according to a second embodiment.
FIG. 7 is a layout drawing illustrating the integrated circuit of the semiconductor device according to the second embodiment.
Figure 8:
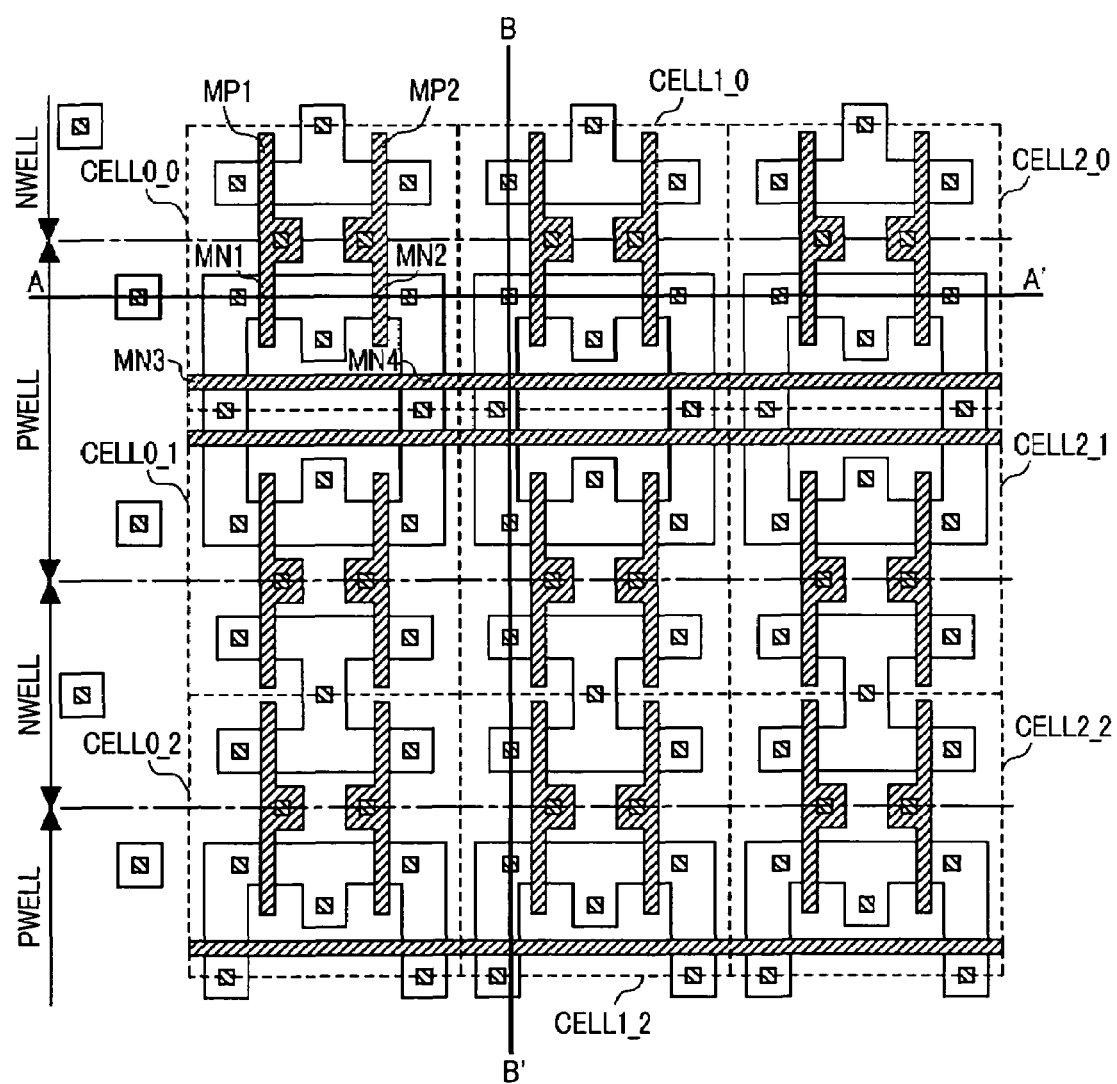
FIG. 8 is a layout drawing illustrating the integrated circuit of the semiconductor device according to the second embodiment.
Figure 9:
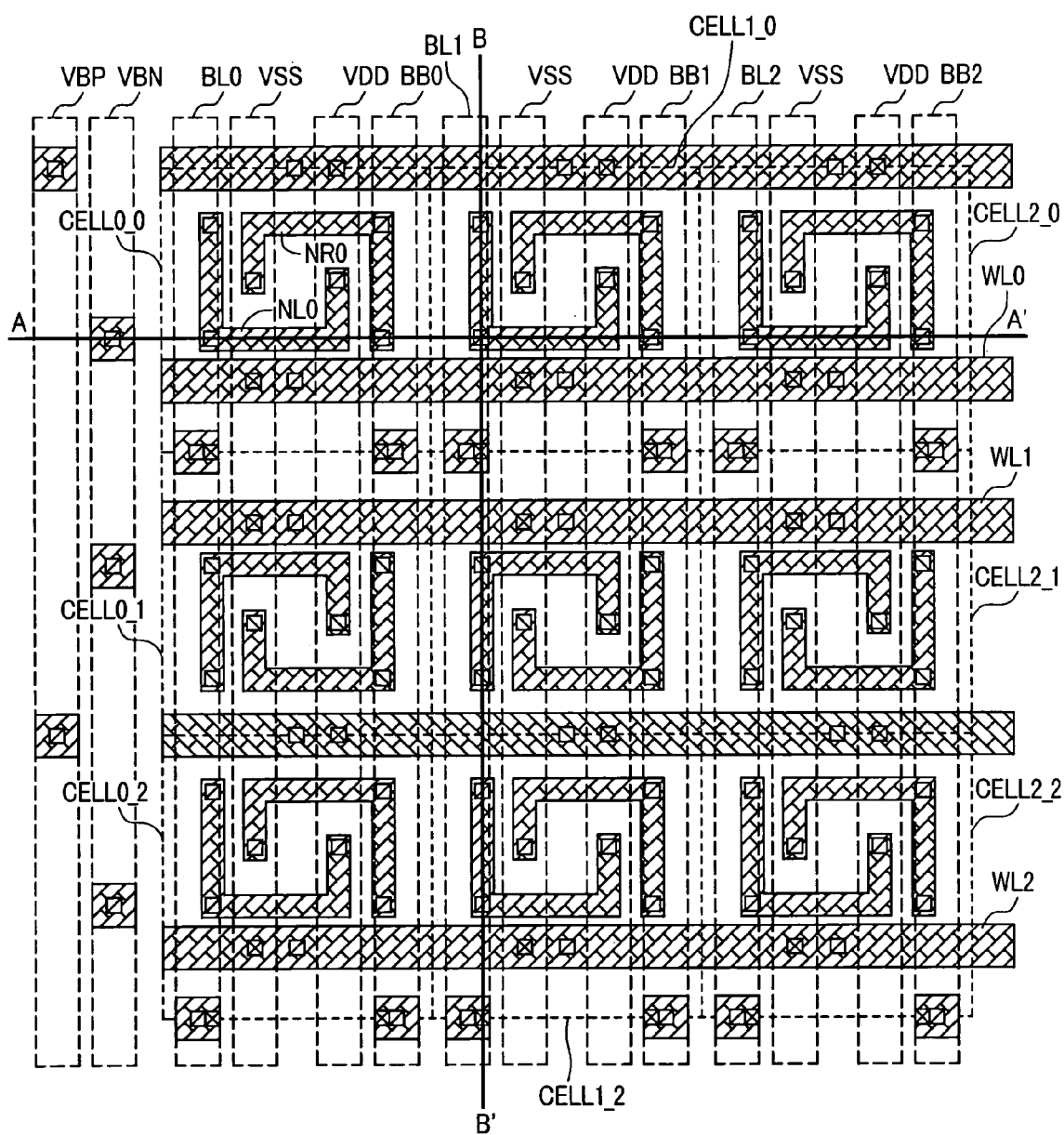
FIG. 9 is a layout drawing illustrating the integrated circuit of the semiconductor device according to the second embodiment.
Figure 10:
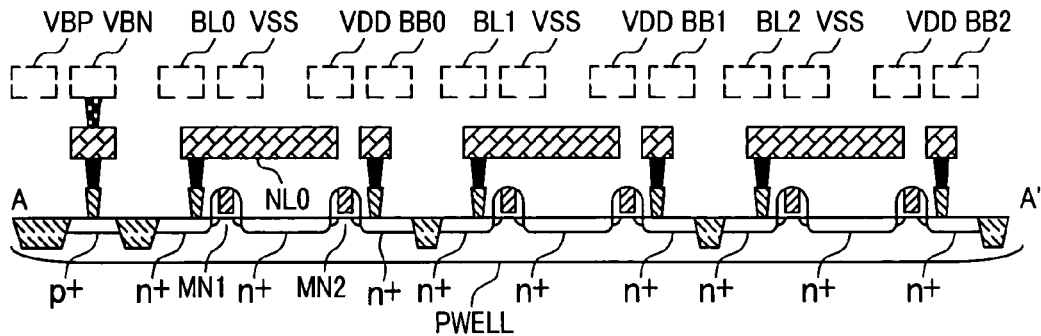
FIG. 10 is a layout drawing illustrating the integrated circuit of the semiconductor device according to the second embodiment.
Figure 11:
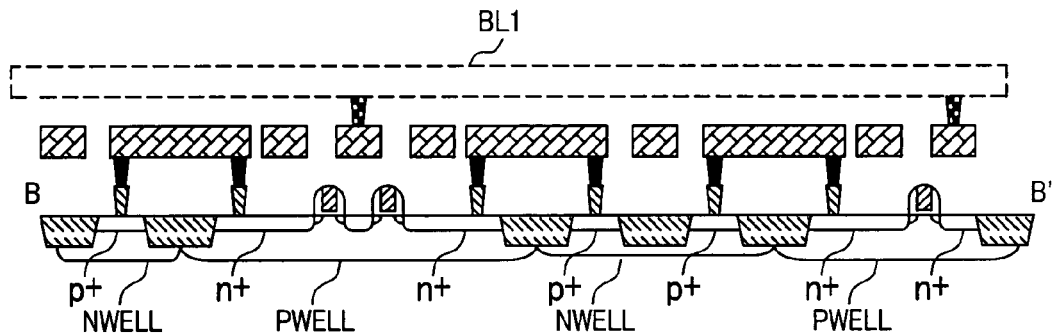
FIG. 11 is a layout drawing illustrating the integrated circuit of the semiconductor device according to the second embodiment.

The array area 100 of the circuit shown in the first embodiment can be configured by use of a layout as shown in FIG. 7. FIG. 6 defines layout layers. A decoder circuit DEC is placed on the left side of the layout; and a column circuit BLOCK_CONT is placed in the lower side of the layout. In a memory array MEM_ARRAY part in the center, memory cells are arranged in an array manner. Word lines are formed in a lateral direction; and bit lines are formed in a longitudinal direction. P-type wells PWELL and N-type wells NWELL are alternately formed in the lateral direction. As is the case with a well to be power supplied, an area for well tap is conductivity type. The area for well tap is a semiconductor area, the impurity concentration of which is high. The area for well tap extends in the same direction as that of the bit lines, and is formed at given intervals in the same direction as that of the word lines. A tap of the P-type well PWELL is connected to a wire VBN formed in the second wiring layer by use of a well tap contact WELLCNT. A tap of the N-type well NWELL is connected to a wire VBP formed in the second wiring layer by use of the well tap contact WELLCNT. Well tap wires (VBP, VBN) are formed, for example, between BLOCKs in the longitudinal direction at intervals of 16-bit columns of a memory cell. It is possible to efficiently prevent a multi-bit error from occurring in a plurality of memory cells adjacent to each other by the following steps: dividing the memory array into a plurality of blocks, each of which being put between two areas for well tap; and with respect to addresses used when reading out data from memory cells into the error-correction circuit to generate data to write, assigning different addresses to memory cells in the same block. FIGS. 8 and 9 are layout drawings illustrating 3 bits (column)×3 bits (row) in the upper left of the memory array. In addition, FIGS. 10 and 11 illustrate cross sections along a line A–A' and a line B–B' respectively. To be more specific, the memory array comprises a plurality of memory cells that are provided at intersection points formed by a plurality of word lines and a plurality of bit lines. Each of the plurality of memory cells comprises first and second P-channel type MISFETs, and third, fourth, fifth, and sixth N-channel type MISFETs. Drains of the first and third MISFETs are connected to gates of the second and fourth MISFETs. Gates of the first and third MISFETs are connected to drains of the second and fourth MISFETs. A source-drain path of the fifth MISFET is connected to a point between a bit line and the drain of the third MISFET. A source-drain path of the sixth MISFET is connected to a point between a bit line, which is twin to the above-mentioned bit line, and the drain of the fourth MISFET. The third, fourth, fifth, and sixth MISFETs have diffusion formed in the same P-type well, and the first and second MISFETs have diffusion formed in the N-type well. In this configuration, there is a plurality of areas for well tap. Here, memory cells, which are put between two adjacent areas for well tap and are connected to the same word line, are not simultaneously read out into the error-correction circuit. A multi-cell error caused by a usual cosmic ray occurs between well taps as a result of bipolar action. By use of the configurations as shown in the first and second embodiments, only one bit is simultaneously read out into the error-correction circuit from memory cells between well taps. Accordingly, even if a multi-bit fail occurs as a result of the bipolar action, simultaneously read bits produce only one bit error. Therefore, even an error-correction circuit ECC capable of simultaneously correcting only one bit error can achieve error correction, making it possible to improve soft error immunity.

Figure 12:
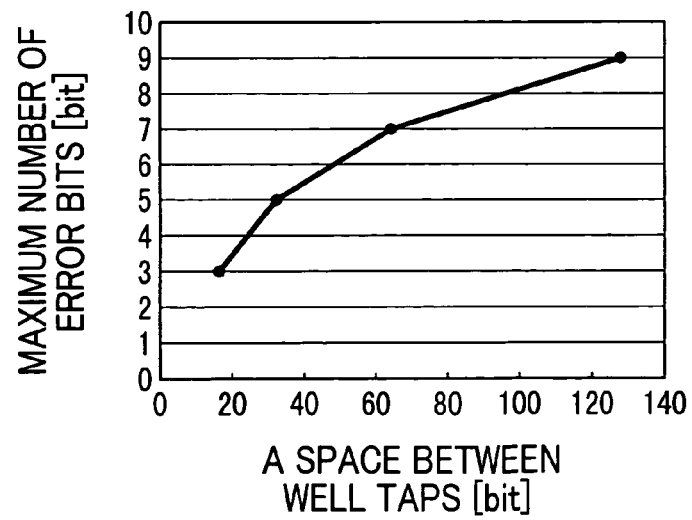
FIG. 12 is a diagram illustrating the relationship between a well tap interval and the maximum number of multi-cell errors according to the second embodiment.

In addition, FIG. 12 illustrates the well-known relationship of a well tap interval with the maximum number of multi-cell errors occurring between well taps. Therefore, instead of simultaneously reading only one bit between wells, for example, if well taps are provided at 16-bit intervals, bits which are away from one another by three bits or more are simultaneously read. Also in this case, simultaneously read data produces only one bit error. Accordingly, correction in the ECC circuit is possible, which improves reliability.

<Third Embodiment>

Figure 13:
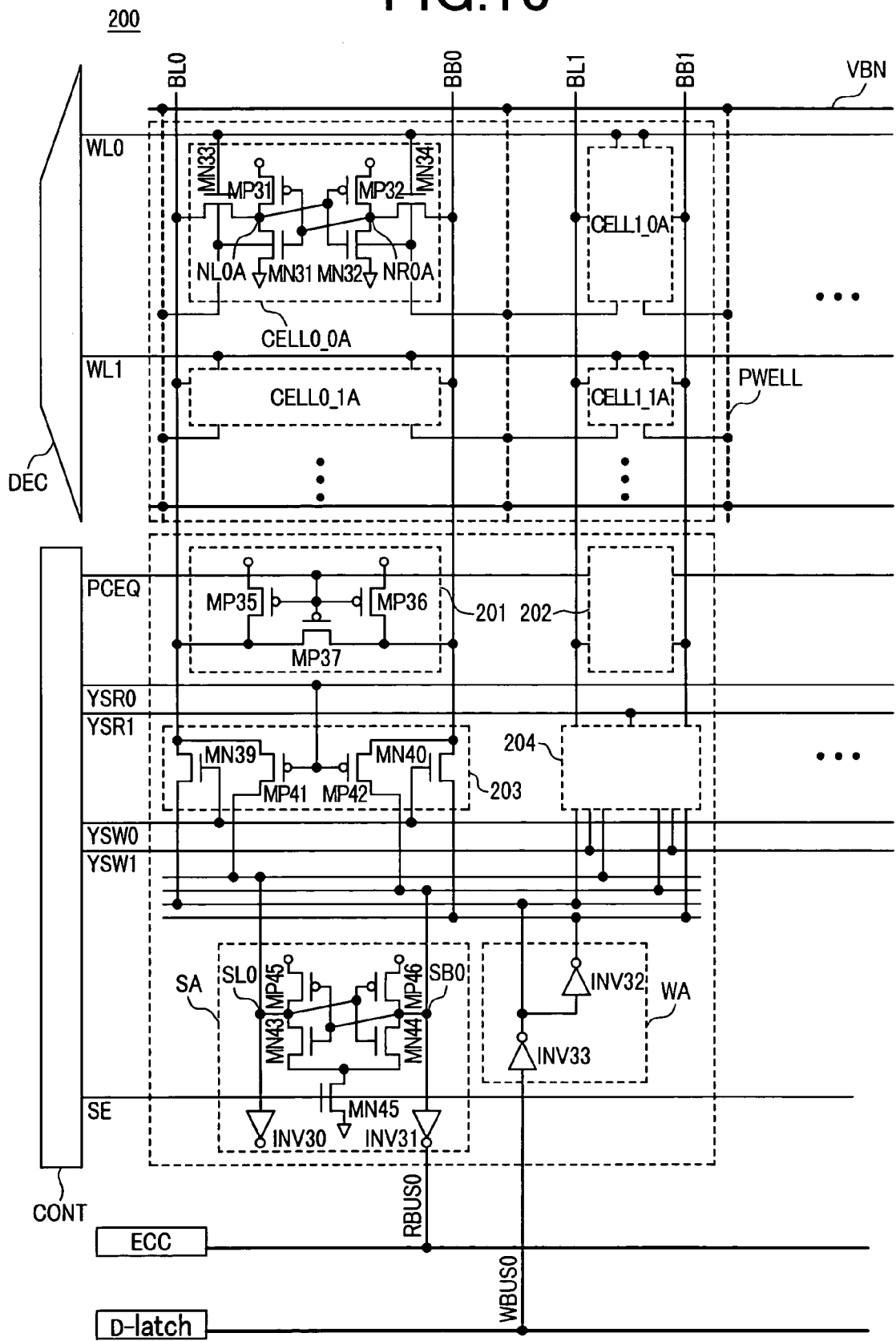
FIG. 13 is a circuit diagram illustrating an integrated circuit of a semiconductor device according to a third embodiment.
Figure 14:
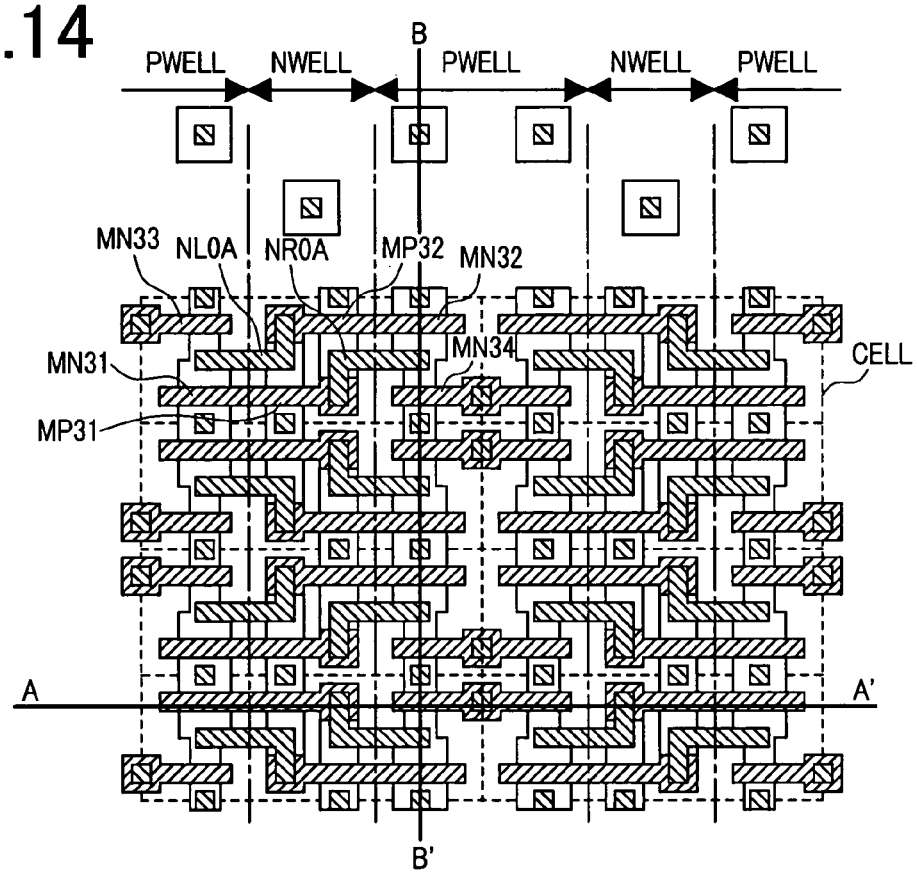
FIG. 14 is a layout drawing illustrating the integrated circuit of the semiconductor device according to the third embodiment.
Figure 15:
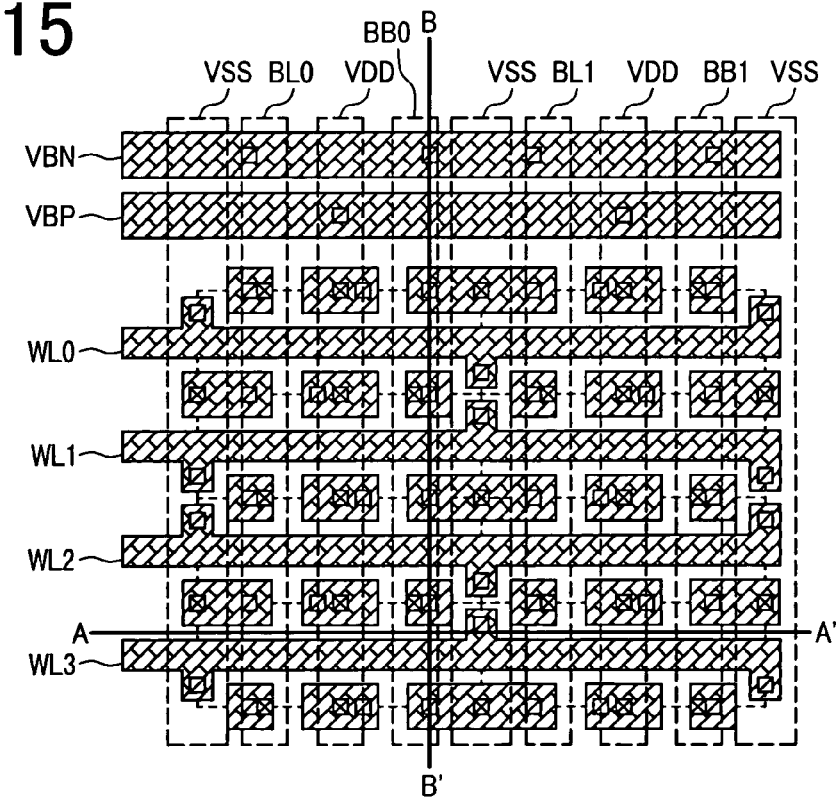
FIG. 15 is a layout drawing illustrating the integrated circuit of the semiconductor device according to the third embodiment.
Figure 16:
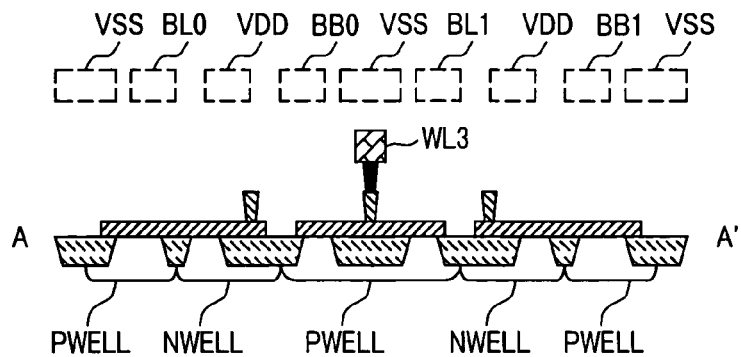
FIG. 16 is a layout drawing illustrating the integrated circuit of the semiconductor device according to the third embodiment.
Figure 17:
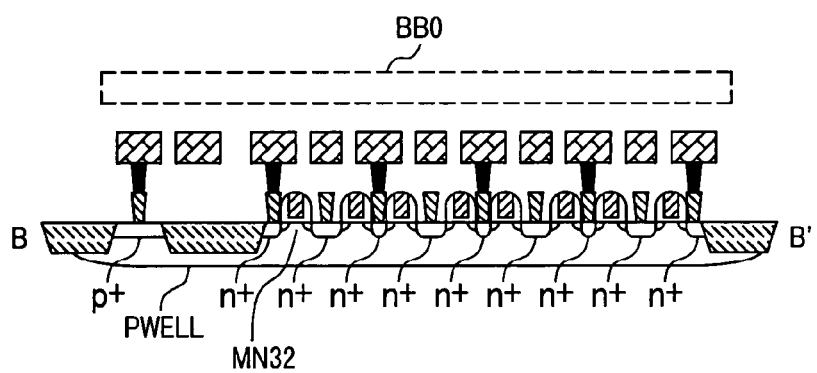
FIG. 17 is a layout drawing illustrating the integrated circuit of the semiconductor device according to the third embodiment.

The array area 100 shown in the first embodiment can also be changed to an array area 200 as shown in FIG. 13. FIGS. 14 and 15 are layout drawings illustrating memory cells equivalent to 2 columns×4 rows. FIGS. 16 and 17 illustrate cross sections along a line A–A' and a line B–B' respectively. A well direction of memory cells shown in a third embodiment is not lateral but longitudinal, which is a point of difference from the memory cells shown in the first and second embodiments. Well taps (VBN, VBP) are formed in the same direction as that of word lines. Accordingly, because words are different in the same well, only one bit is automatically read from the same well at the same time. Therefore, even if multi-errors occur in the same well, the error-correction circuit can correct the errors. In this case, as shown in FIG. 13, it is effective to configure such an array configuration that, for example, one sense amplifier SA and one write amplifier WA are shared by two columns of memory cells CELL.

<Fourth Embodiment>

Figure 18:
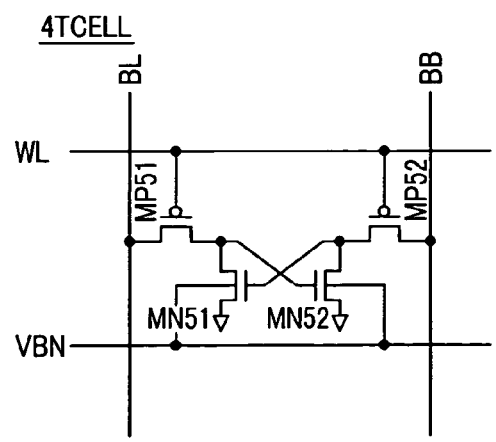
FIG. 18 is a circuit diagram illustrating memory cells of an integrated circuit of a semiconductor device according to a fourth embodiment.
Figure 19:
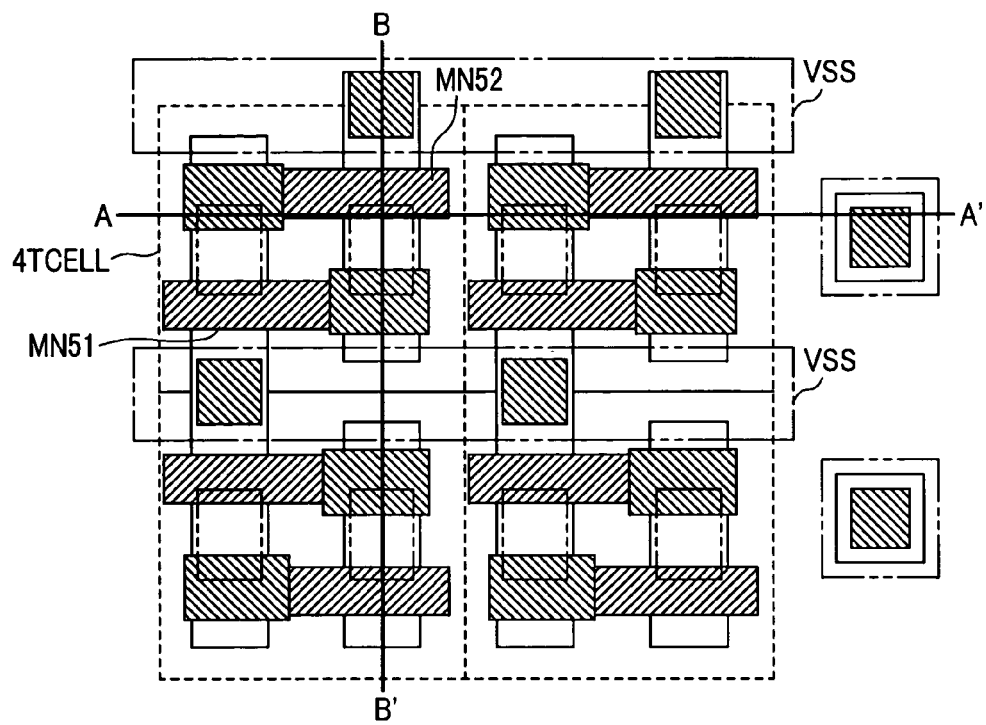
FIG. 19 is a layout drawing illustrating the integrated circuit of the semiconductor device according to the fourth embodiment.
Figure 20:
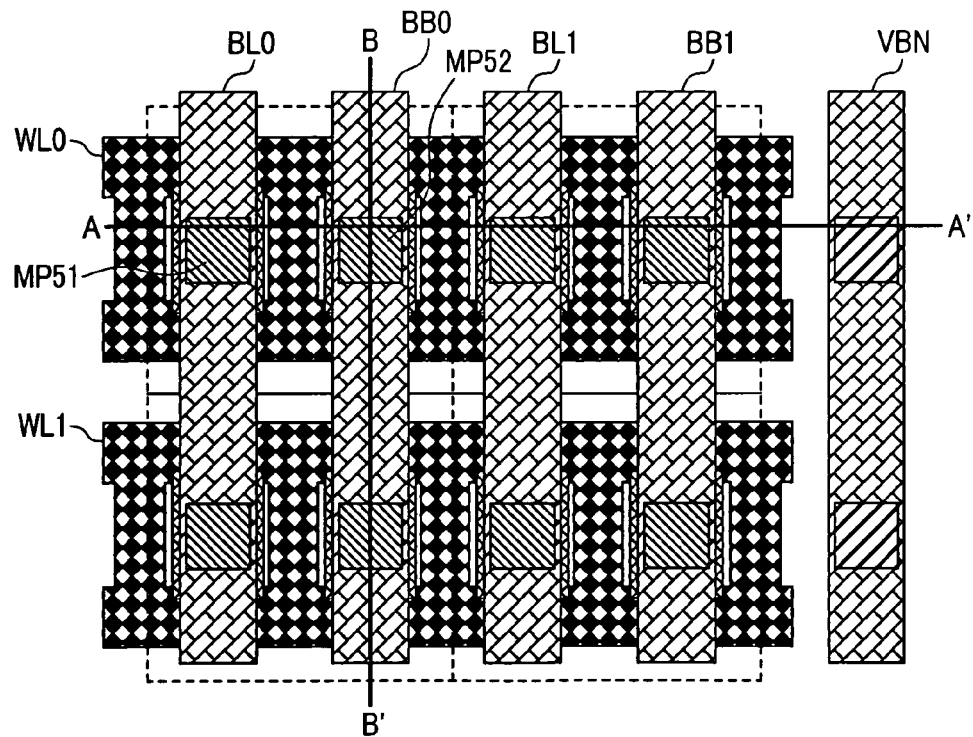
FIG. 20 is a layout drawing illustrating the integrated circuit of the semiconductor device according to the fourth embodiment.
Figure 21:
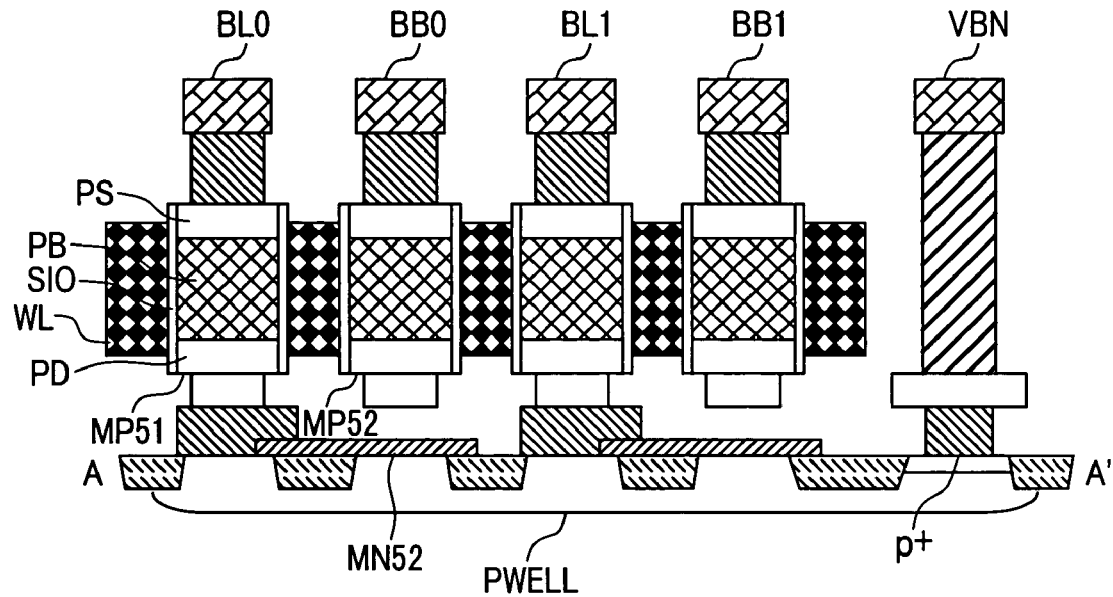
FIG. 21 is a layout drawing illustrating the integrated circuit of the semiconductor device according to the fourth embodiment.
Figure 22:
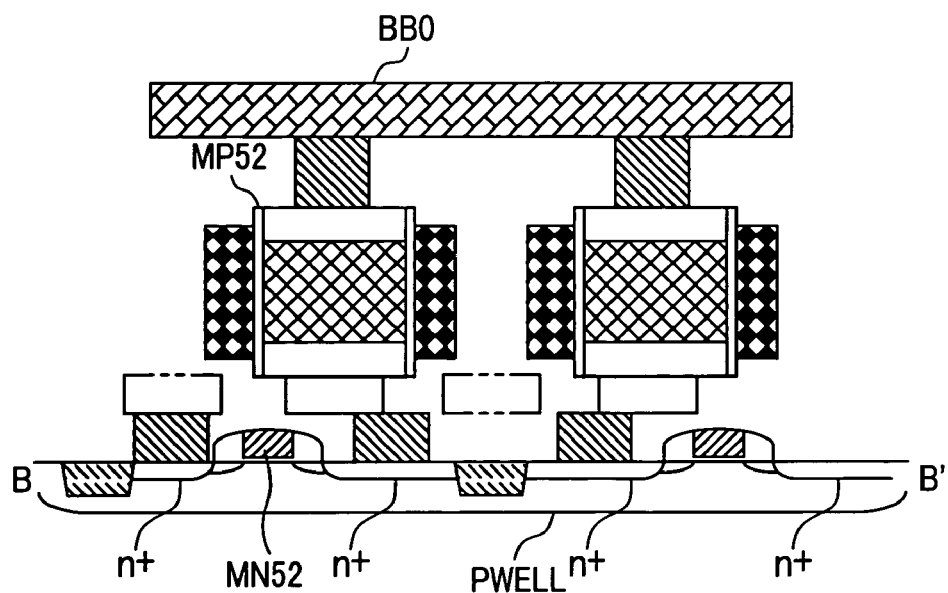
FIG. 22 is a layout drawing illustrating the integrated circuit of the semiconductor device according to the fourth embodiment.

The first and second embodiments can also be configured as a four-transistor SRAM memory cell 4TCELL, which is constituted of four transistors as shown in FIG. 18. More specifically, N channel type MOS transistors (MN51, MN52) and P channel type MOS transistors (MP 51, MP 52) constitute the four-transistor SRAM memory cell 4TCELL. The P channel type MOS transistors carry out the functions of a transfer MOS and a load MOS by use of four transistor SRAMs. FIGS. 19 and 20 are layout drawings; and FIGS. 21 and 22 illustrate cross sections along a line A–A' and a line B–B' respectively. The P channel type MOS transistors (MP 51, MP 52) may use, what is called, a usual CMOS process in which diffusion forms a pn junction in a semiconductor substrate. However, in order to reduce a chip area, it is effective to use vertical MOSFETs formed on a substrate as shown in FIGS. 19 through 22. The vertical P channel type MOS transistors (MP 51, MP 52) comprise the following: a square pole-shaped stacked vertical device SV into which a bottom part of device (drain) PD, a middle part of device PB, and an upper part of device (source) PS are laminated; and a gate poly-silicon SVG that is generated on a side wall of this stacked vertical device SV through a gate oxide SIO. All of the memory cell wells in the substrate become P type. Therefore, it is desirable that in order to efficiently use the error-correction circuit ECC in the event of a multi-cell error, a well tap be formed in a bit line direction, and only one bit be simultaneously read out into the error-correction circuit between well taps. In this embodiment, the 4TCELLSRAM is taken as an example. However, the present invention can also be applied to a case where in the SRAM memory cell of the first embodiment, the MOS transistor to be formed as a P-channel type is formed on the substrate as a vertical MISFET while the MOSFET to be formed as an N-channel type is formed in the semiconductor substrate by its diffusion. In other words, it is effective for a memory cell in which the first conductivity type MOS transistor is formed on the substrate and the second conductivity type MOS transistor is formed in the substrate. It is to be noted that the transistor which is described as the MOS transistor may also be changed to be a MISFET, an insulated layer of which is not limit to an oxide layer.

According to the present invention, it is possible to increase the writing speed, and also to efficiently perform error correction such as a soft error.

<Explanations of Letters or Numerals>
100, 200 Array areas
101, 102, 201, 202 Pre-charge and equalize circuits
103, 104, 203, 204 Y switch circuits
4TCELL Four-transistor SRAM memory cell
ADD-IO Address input pad
A-Latch Address latch circuit
A-SEL Address select circuit
BB, BL Data line
BLOCK Memory block
BLOCK_CONT Column circuit
C Additive capacity
CELL SRAM memory cell
CHIP Semiconductor integrated circuit
CK Clock signal
CMP Comparator
CONT Column control circuit
DATA-IO Data input/output pad
DEC Decoder circuit
D-Latch Data latch circuit
D-SEL Data selection circuit
ECC Error-correction circuit
IN Input data
INV Inverter circuit
Latch Latch circuit
MEM_ARRAY Memory array
MN N channel type MOS transistor
MP P channel type MOS transistor
NL, NR connection node
NWELL N-type well
OUT Output data
PARITY Parity generation circuit
PB Middle part of device
PCEQ Control signal for pre-charge and equalize circuit
PD Drain
PS Source
PWELL P-type well
RBUS Data bus for read data
SA Sense amplifier
SE Sense amplifier control signal
SIO Gate oxide
SL, SB sense amplifier output signal
VBN P well tap
VBP N well tap
VDD Power supply potential
VSS Ground potential
WA Write amplifier
WBUS Data bus for write data
WE, /WE Write select signal
WELLCNT Well tap
WL Word line
YSR, YSW Y switch control signal

What is claimed is:

1. A semiconductor device comprising:
   a plurality of bit-line pairs;
   a plurality of word lines;
   a plurality of memory cells provided at intersection points formed by the plurality of bit-line pairs and the plurality of word lines;
   a plurality of sense amplifiers, each of which is provided for each given number of bit-line pairs from among the plurality of bit-line pairs;
   a plurality of write amplifiers, each of which is provided for said each given number of bit-line pairs;
   a control circuit that selectively connects one of the given number of bit-line pairs to the sense amplifier, and that selectively connects one of the given number of bit-line pairs to the write amplifier;
   an error-correction circuit;
   a data storing circuit for storing data to write; and
   an address storing circuit for storing an address corresponding to the data to write; wherein:
   said error-correction circuit corrects an error of data read out corresponding to a first writing address, and then generates first data to write;
   said data storing circuit stores the first data to write; and after a second writing address is inputted into the address storing circuit, said write amplifier writes the first data to write to the memory cell.

2. The semiconductor device according to claim 1, said semiconductor device further comprising:
   a first data path for connecting between the sense amplifier and the error-correction circuit; and
   a second data path for connecting between the write amplifier and the error-correction circuit.

3. The semiconductor device according to claim 2, said semiconductor device further comprising a parity generation circuit, wherein:
   said second data path includes in its path the data storing circuit and the parity generation circuit.

4. The semiconductor device according to claim 3, wherein:
   said sense amplifier is a latching sense amplifier;
   operation by which first read data from a memory cell corresponding to the first writing address is read out into the sense amplifier, and operation by which the parity generation circuit generates parity according to the first read data and then the parity is stored in the data storing circuit, are performed before the second writing address is decoded; and
   the second writing address is decoded, and subsequently second read data from a memory cell corresponding to the second writing address is stored in the sense amplifier, and after that, data stored in the data storing circuit is written to a memory cell corresponding to the first writing address.

5. The semiconductor device according to claim 1, wherein:
   said data storing circuit has the capacity large enough to store two pieces of data to write or more; and
   said address storing circuit has the capacity large enough to store two addresses or more.

6. The semiconductor device according to claim 5, said semiconductor device further comprising:
   a comparator that compares an address stored in the address storing circuit with an address inputted into the semiconductor device to output the result of the address comparison.

7. The semiconductor device according to claim 6, said semiconductor device further comprising a data input/output pad, wherein:
   said comparator compares some bits of the addresses; and
   if the address inputted into the semiconductor device is an address used for read operation, and if the addresses agree with each other, data stored in the data storing circuit is output to the data input/output pad, whereas if the addresses do not agree with each other, data of a memory cell corresponding to the address is read, and then the data is output to the data input/output pad via the error-correction circuit.

8. The semiconductor device according to claim 1, wherein:
   a size of a transistor forming the data storing circuit is larger than that of a transistor forming the memory cell.

9. The semiconductor device according to claim 1, wherein:
   said plurality of memory cells are SRAM memory cells.

* * * * *